US006444401B1

(12) United States Patent
Lee

(10) Patent No.: US 6,444,401 B1
(45) Date of Patent: Sep. 3, 2002

(54) FABRICATION OF FIELD EMITTING TIPS

(75) Inventor: Szetsen Steven Lee, Taipei (TW)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 09/514,372

(22) Filed: Feb. 28, 2000

Related U.S. Application Data

(62) Division of application No. 09/326,031, filed on Jun. 4, 1999, now Pat. No. 6,064,145.

(51) Int. Cl.[7] .................................................. G03F 7/00

(52) U.S. Cl. ....................... 430/312; 430/313; 430/314; 430/316

(58) Field of Search ................................. 430/312, 313, 430/314, 316

(56) References Cited

U.S. PATENT DOCUMENTS 5,378,658 A 1/1995 Toyoda et al. ................ 438/20
5,389,026 A 2/1995 Fukuta et al. ................. 445/24
5,391,259 A 2/1995 Cathey et al. ................ 438/20
5,424,605 A 6/1995 Lovoi ......................... 313/422
5,427,977 A 6/1995 Yamada et al. ............... 438/22
5,462,467 A 10/1995 Macaulay et al. ............ 445/50
5,477,105 A 12/1995 Curtin et al. ............... 313/422
5,541,473 A 7/1996 Duboc, Jr. et al. .......... 313/422
5,559,389 A 9/1996 Spindt et al. ............... 313/310
5,562,516 A 10/1996 Spindt et al. ................ 445/24
5,564,959 A 10/1996 Spindt et al. ................ 445/24
5,576,594 A 11/1996 Toyoda et al. .............. 313/309
5,578,185 A 11/1996 Bergeron et al. ........... 205/123
5,580,380 A 12/1996 Liu et al. ...................... 117/85
5,597,518 A 1/1997 Lovoi ........................ 264/1.21
5,607,335 A 3/1997 Spindt et al. ................. 445/50
5,608,283 A 3/1997 Twichell et al. ............ 313/309
5,658,710 A 8/1997 Neukermans ............... 430/320
5,663,611 A 9/1997 Seats et al. ................. 313/584
5,674,351 A 10/1997 Lovoi ...................... 156/629.1
5,686,790 A 11/1997 Curtin et al. ............... 313/495
5,695,658 A 12/1997 Alwan ......................... 216/42
5,727,977 A * 3/1998 Maracas et al. .............. 445/24
5,751,107 A 5/1998 Komatsu .................... 313/496
5,753,130 A 5/1998 Cathey et al. ................ 216/11
5,755,944 A 5/1998 Haven et al. ............... 204/486
5,763,987 A 6/1998 Morikawa et al. .......... 313/309
5,798,604 A 8/1998 Duboc, Jr. et al. .......... 313/495
5,911,616 A * 6/1999 Levine et al. ................. 445/52
5,935,766 A * 8/1999 Cheek et al. ............... 430/316

FOREIGN PATENT DOCUMENTS

JP 1-128522 * 5/1989

OTHER PUBLICATIONS

Uh et al., "New fabrication method of silicon field emitter arrays using thermal oxidation," J. Vac. Sci. Technol. (1995), 13:456–460.

* cited by examiner

*Primary Examiner*—Mark F. Huff
*Assistant Examiner*—Nicole Barreca
(74) *Attorney, Agent, or Firm*—Finnegan, Henderson, Farabow, Garrett & Dunner, L.L.P.

(57) ABSTRACT

A method of forming a field emission device for a flat panel display includes operating a projection exposure apparatus. This comprises placing three layers of exposure sensitive material on a device in succession, with steps of exposure and removal of material between deposition of subsequent layers of exposure sensitive material. Furthermore, a field emission device is formed by exposing a third layer of exposure sensitive material, wherein a tip on the field emission device or plurality of tips on the field emission devices can be obtained with differing sharpness characteristics by varying the depth and diameter of holes in a mask used during exposure of exposure sensitive material.

4 Claims, 26 Drawing Sheets

FABRICATION OF FIELD EMITTING TIPS

This is a division of parent application Ser. No. 09/326,031, filed Jun. 4, 1999, now U.S. Pat. No. 6,064,145. The contents of this parent application is being relied upon and incorporated by reference herein.

BACKGROUND OF THE INVENTION

1. Field of the Invention

The present invention relates to a method of fabricating a field emitting tip and a field emitting tip made by such a method. The field emitting tip of the present invention can be employed in a flat panel display.

2. Description of the Prior Art

A flat panel display (FPD) can include a number of field emission devices (FED). Various fabrication techniques for manufacturing a cathode used in a FED have been proposed when manufacturing a FPD including a FED.

FIG. 1 illustrates the structure of a conventional FED. An anode plate 10 is provided to receive electrons 20 from a cathode 30. A metal ring 40, which focuses the electron emission, is provided.

FIGS. 2(*a*)–(*f*) illustrate a conventional process of manufacturing cathode 30 as shown in FIG. 1. The process begins with a bare silicon substrate 50. To form a cap 60, a small layer of $SiO_2$ is deposited on the silicon substrate and then a layer of $Si_3N_4$ is provided thereon. As shown in FIG. 2(*a*), the layers of $SiO_2$ and $Si_3N_4$ are patterned and subjected to a reactive ion etch (RI E) to form cap 60 for the field emission tip of the device.

An isotropic silicon etch is performed to remove a portion of silicon from the surface of substrate 50. As illustrated in FIG. 2(*b*), cap 60 protects part of silicon substrate 50 from the etch and a pyramid structure 70, which is a characteristic of the prior art field emission tip, is produced.

As shown in FIG. 2(*c*), after pyramid structure 70 is formed, portions of silicon surrounding the pyramid are etched. Thermal oxidation is then performed to sharpen the field emission tip, which leaves an oxidation layer 80.

As shown in FIG. 2(*d*), an insulating layer 90 is then deposited to a desired thickness by evaporation. After insulating layer 90 is formed, a mask material 120 is laid down and patterned to define the array edges and metal 100 is deposited to form a metal ring 110.

Finally, as shown in FIG. 2(*f*), mask 120 and cap 60 are removed along with the material formed on cap 60 and mask 120 during the process to form the field emission device having metal ring 110.

Hyung Soo Uh and Jong Duk Lee, "New Fabrication Method of Silicon Field Emitter Arrays Using Thermal Oxidation," J. Vac. Sci. Tech. B 13(2) pages 456–60 (1995) describes a similar process using a well region formed in a semiconductor substrate. FIGS. 3(*a*)–3(*f*) illustrate this process, where FIGS. 3(*e*) to 3(*f*) illustrate the overlying structure being lifted off by etching the oxide surrounding the tip using a buffered hydrofluoric acid (HF) solution.

These conventional processes to produce a field emitting tip, however, suffer certain deficiencies. For example, because the conventional processes use a thermal oxidation process to sharpen the tapered profile of the silicon field emitting tip, the processes are time consuming. Further, the thermal oxidation process is not easy to control and, thus, the degree of sharpness of a tip may be degraded due to uncertainties based on the degree of oxidation. Also, cap 60, which functions as a hard mask during the processes, may fracture if processing is not carefully controlled. As described, for example, in U.S. Pat. No. 5,753,130, a special kind of micro-sphere hard mask can be used in the formation of sharp tips in an attempt to alleviate this problem, but providing a special mask is undesirable.

SUMMARY OF THE INVENTION

Accordingly, the present invention is directed to a method of forming a semiconductor device, a method of operating a projection exposure apparatus, and a semiconductor device that substantially obviate one or more of the problems due to limitations and disadvantages of the prior art. To achieve these and other advantages and in accordance with the purpose of the invention, as embodied and broadly described herein, the invention can comprise a method of forming a semiconductor device including forming a hole in a surface of a substrate, covering the surface with a layer of semiconductor material so that a valley is formed in the layer of semiconductor material above the hole, providing masking material in the valley, and etching the masking material and the layer of semiconductor material to form a portion of the layer into a structure having a peak above the hole.

In another aspect of the invention, a method of operating a projection exposure apparatus can include placing a first layer of exposure sensitive material on a first layer of material of a device, exposing the first layer of exposure sensitive material using a mask, removing portions of the first layer of material in accordance with the exposure of the first layer of exposure sensitive material, placing a second layer of exposure sensitive material on a second layer of material of the device, exposing the second layer of exposure sensitive material using the mask, removing portions of the second layer of material in accordance with the exposure of the second layer of exposure sensitive material, placing a third layer of exposure sensitive material on a third layer of material of the device, and exposing the third layer of exposure sensitive material using the mask.

In a further aspect of the present invention a semiconductor device includes a first layer of material having a hole in its upper surface, and a second layer of material covering the hole, wherein the second layer of material includes a peak structure that is disposed in correspondence with the hole in the upper surface of the first layer of material.

Additional advantages of the invention will be set forth in part in the description which follows, and in part will be obvious from the description, or may be learned by practice of the invention. The advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate the embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

A process flow for making tip and metal ring components of a field emission device (FED) consistent with the present invention is described next.

FIG. 4(*a*) illustrates a state of a device during initial processing of a bare substrate 400. For a FED, substrate 400 is preferably conductive and may include, for example, silicon.

Figure 1:
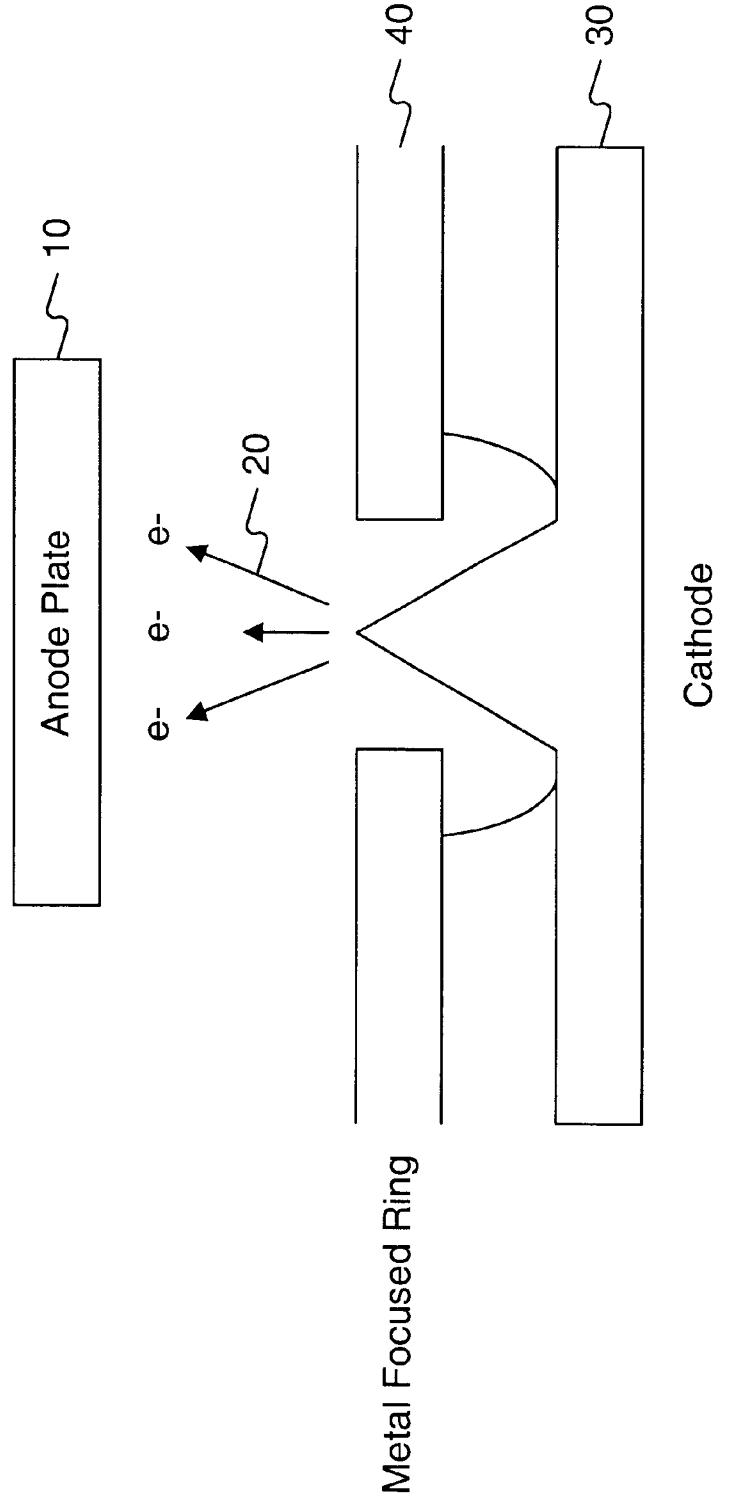
Fig. 1 Prior Art
FIG. 1 is a sectional view of a conventional field emission device.
Figure 2A:
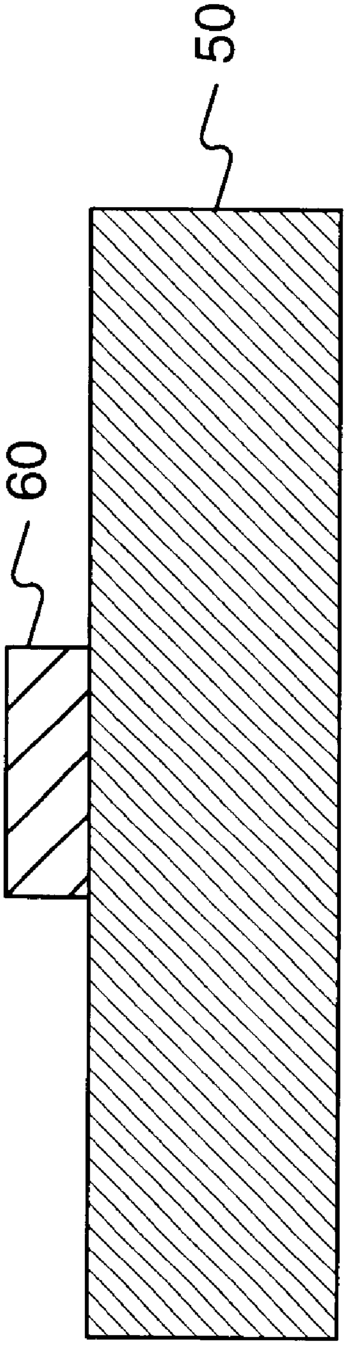
Fig. 2(a) Prior Art
FIGS. 2(*a*)–2(*f*) are sectional views of structures at steps in a manufacturing process according to a conventional process of forming a FED.
Figure 2B:
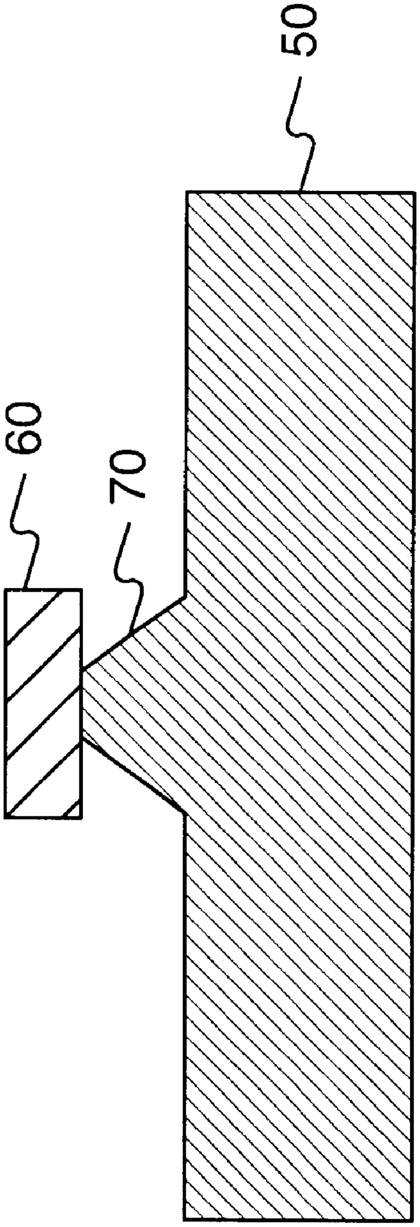
Fig. 2(b) Prior Art
Figure 2C:
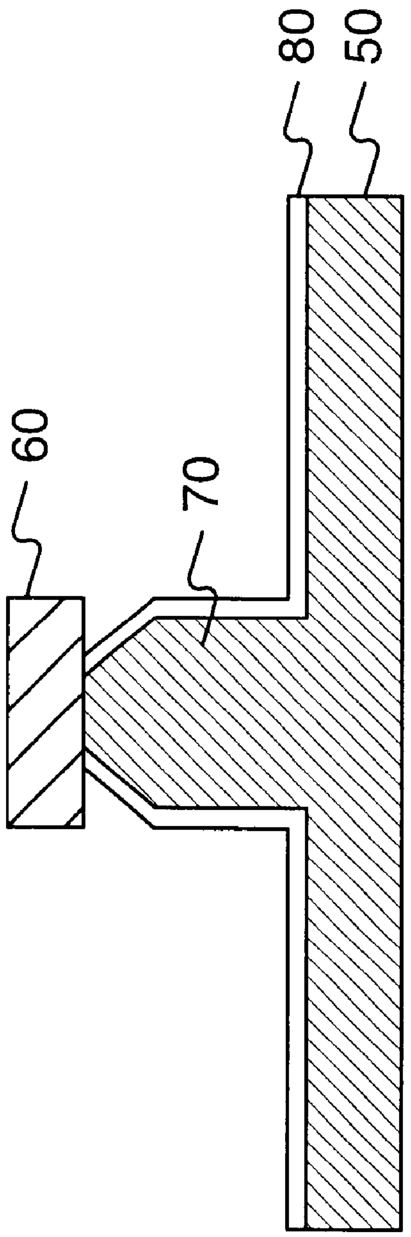
Fig. 2(c) Prior Art
Figure 2D:
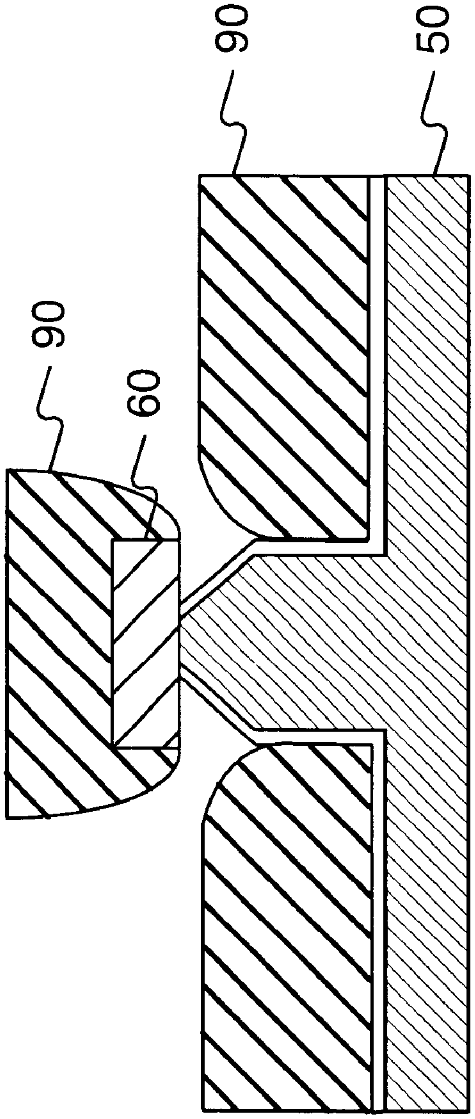
Fig. 2(d) Prior Art
Figure 2E:
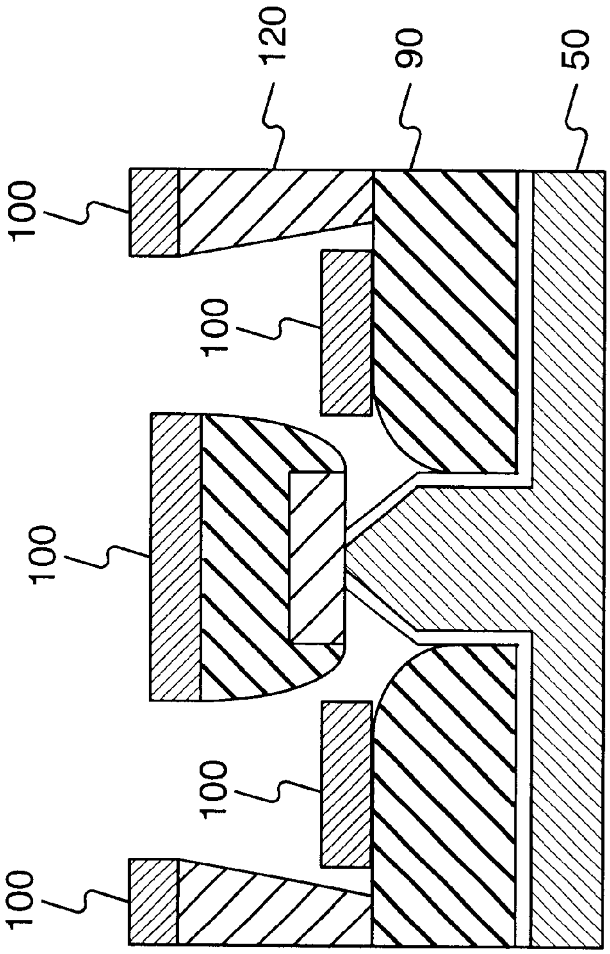
Fig. 2(e) Prior Art
Figure 2F:
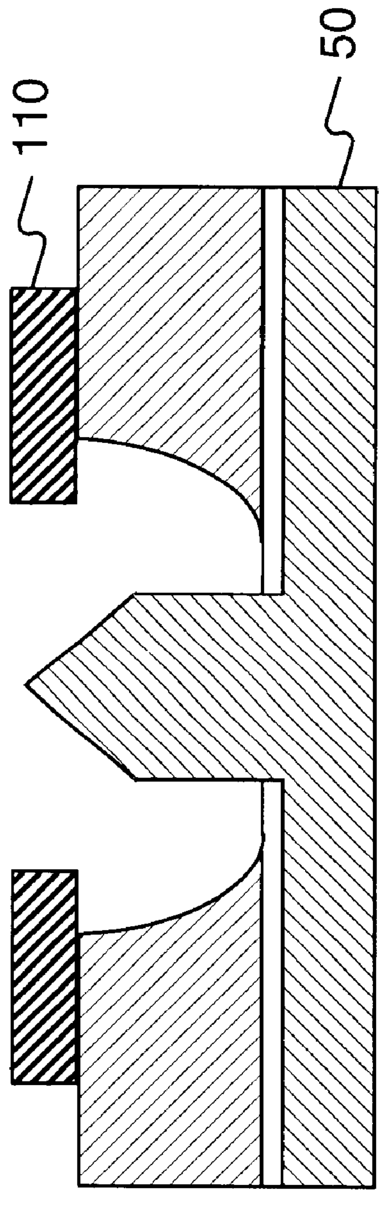
Fig. 2(f) Prior Art
Figure 3A:
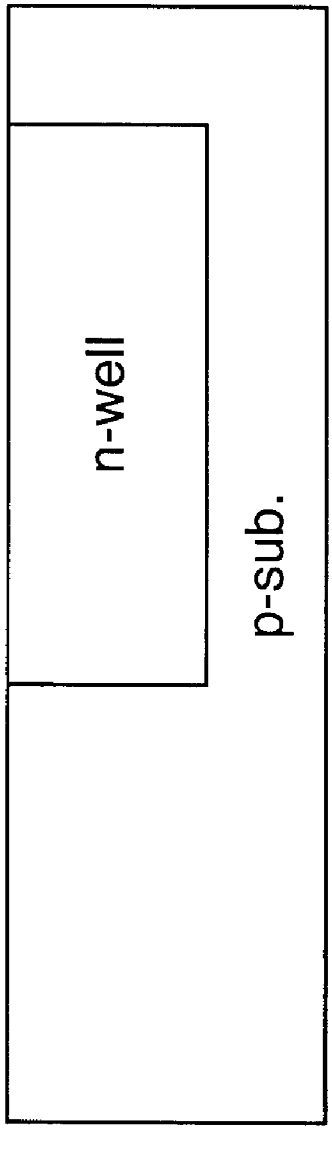
Fig. 3(a) Prior Art
FIGS. 3(*a*)–3(*f*) are sectional views of structures at steps in a manufacturing process according to another conventional process of forming a FED.
Figure 3B:
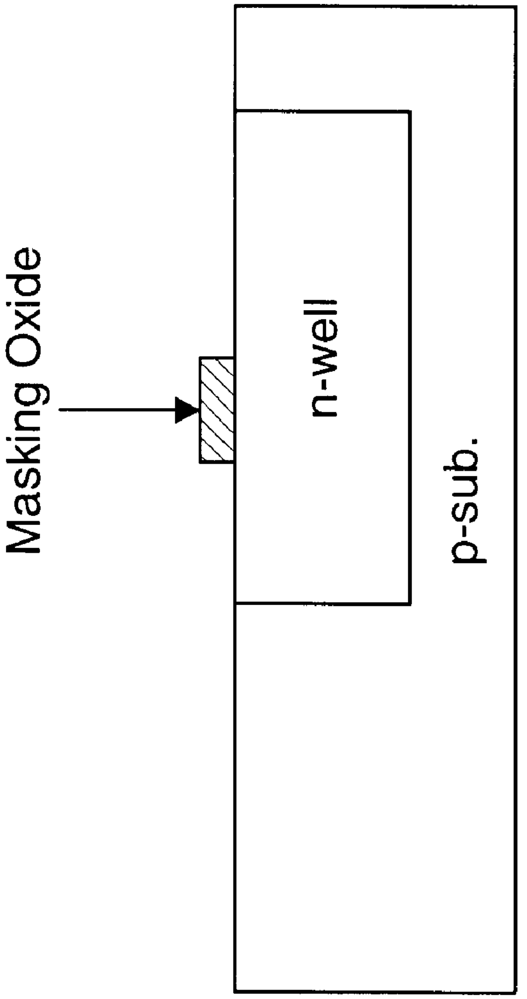
Fig. 3(b) Prior Art
Figure 3C:
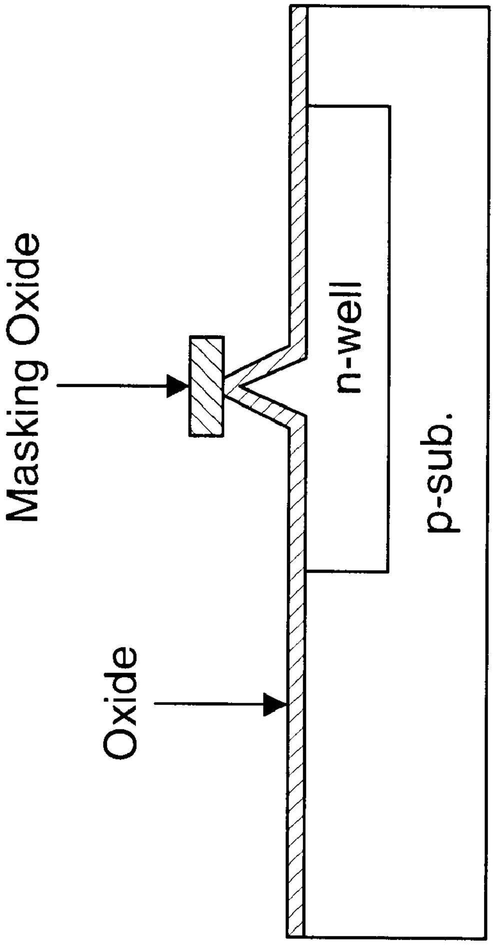
Fig. 3(c) Prior Art
Figure 3D:
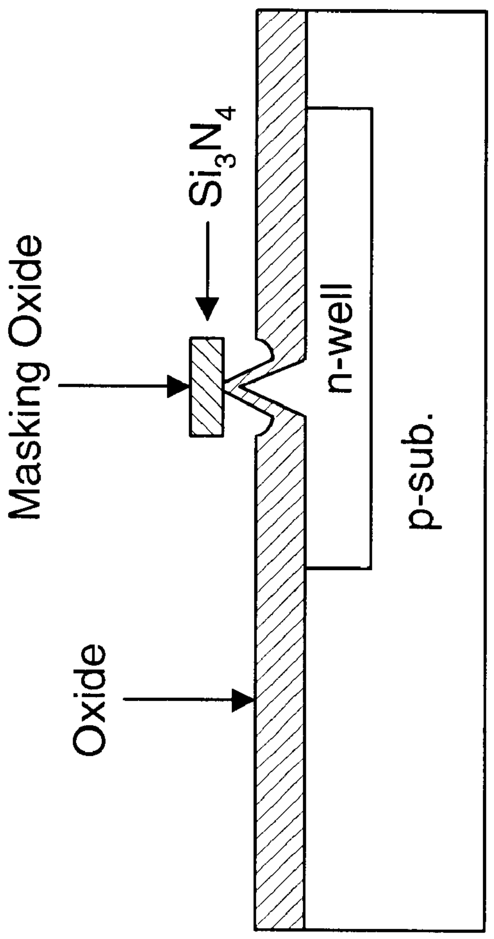
Fig. 3(d) Prior Art
Figure 3E:
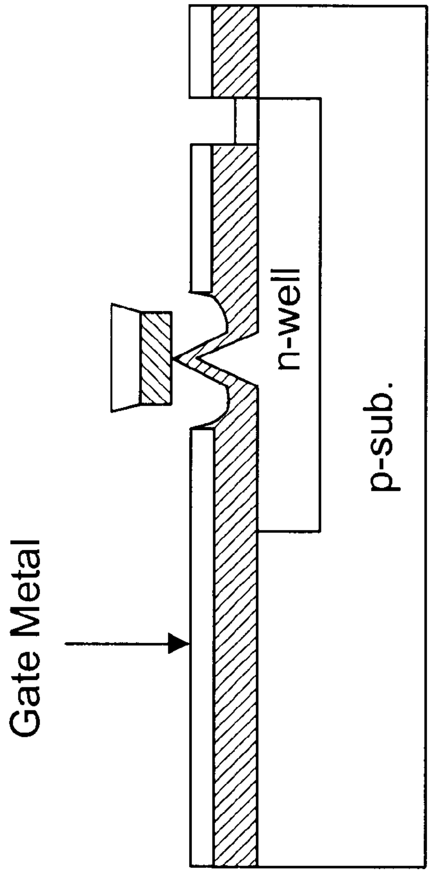
Fig. 3(e) Prior Art
Figure 3F:
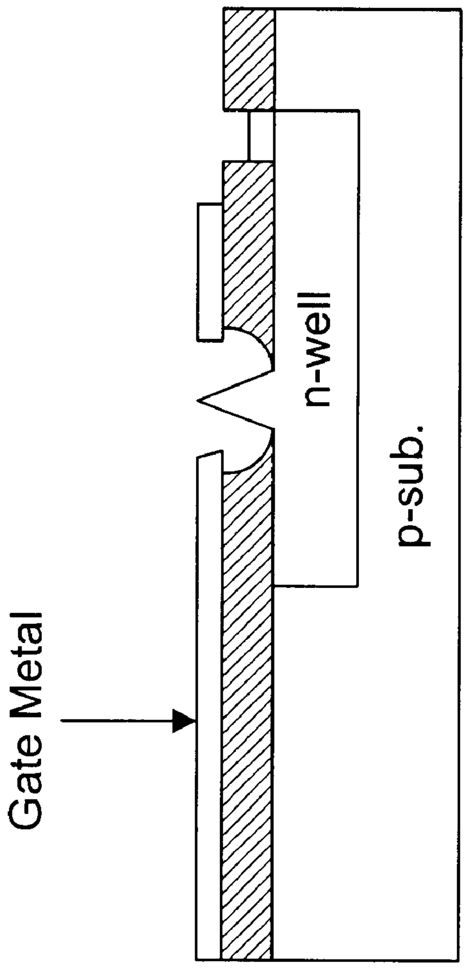
Fig. 3(f) Prior Art
Figure 4A:
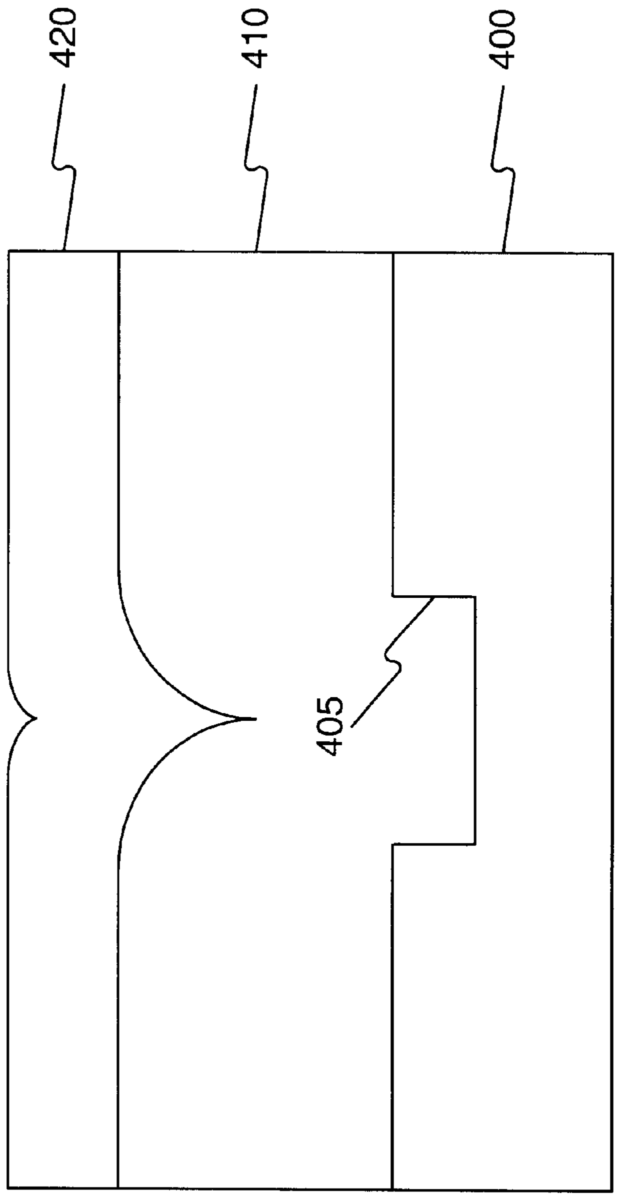
FIGS. 4(*a*)–4(*k*) are sectional views of structures at steps in a manufacturing process of forming a FED consistent with the present invention.
Figure 4B:
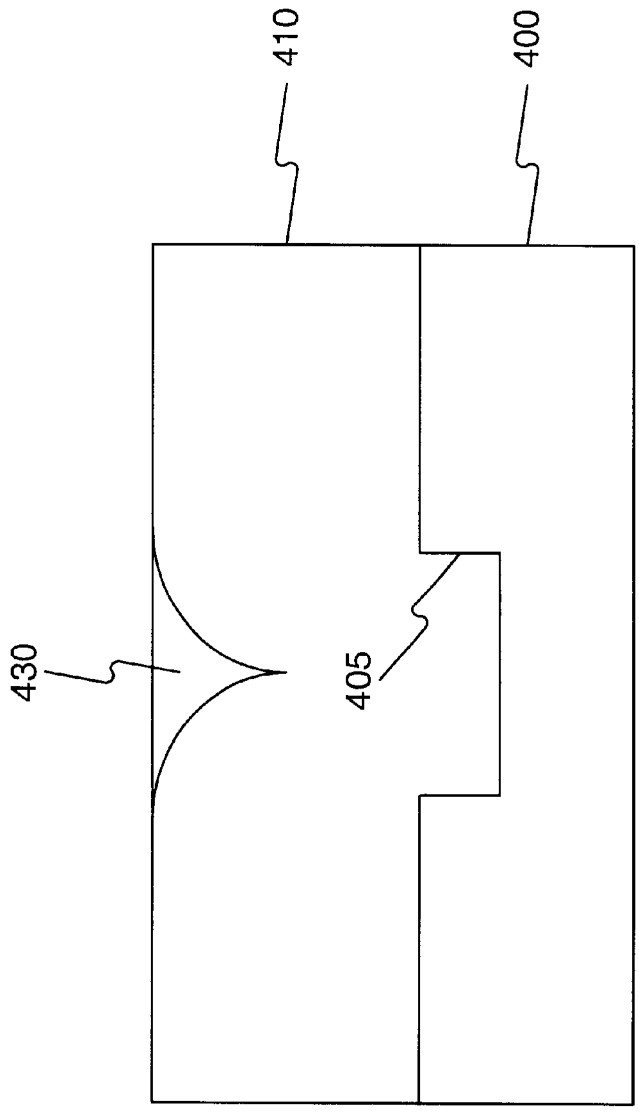
Figure 4C:
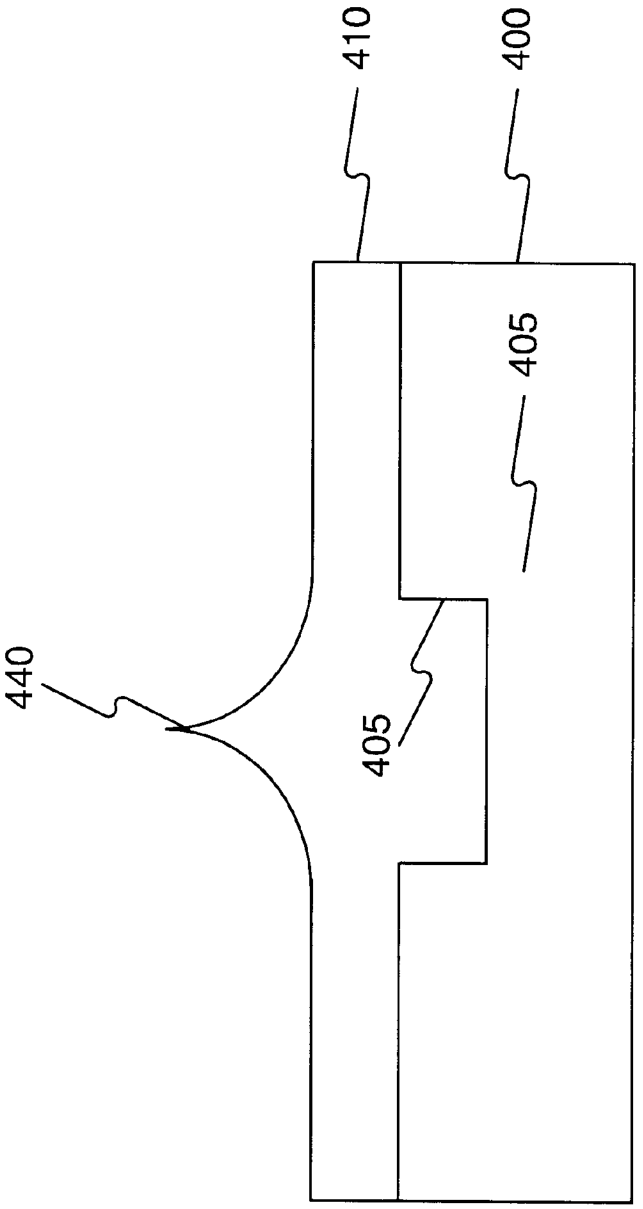
Figure 4D:
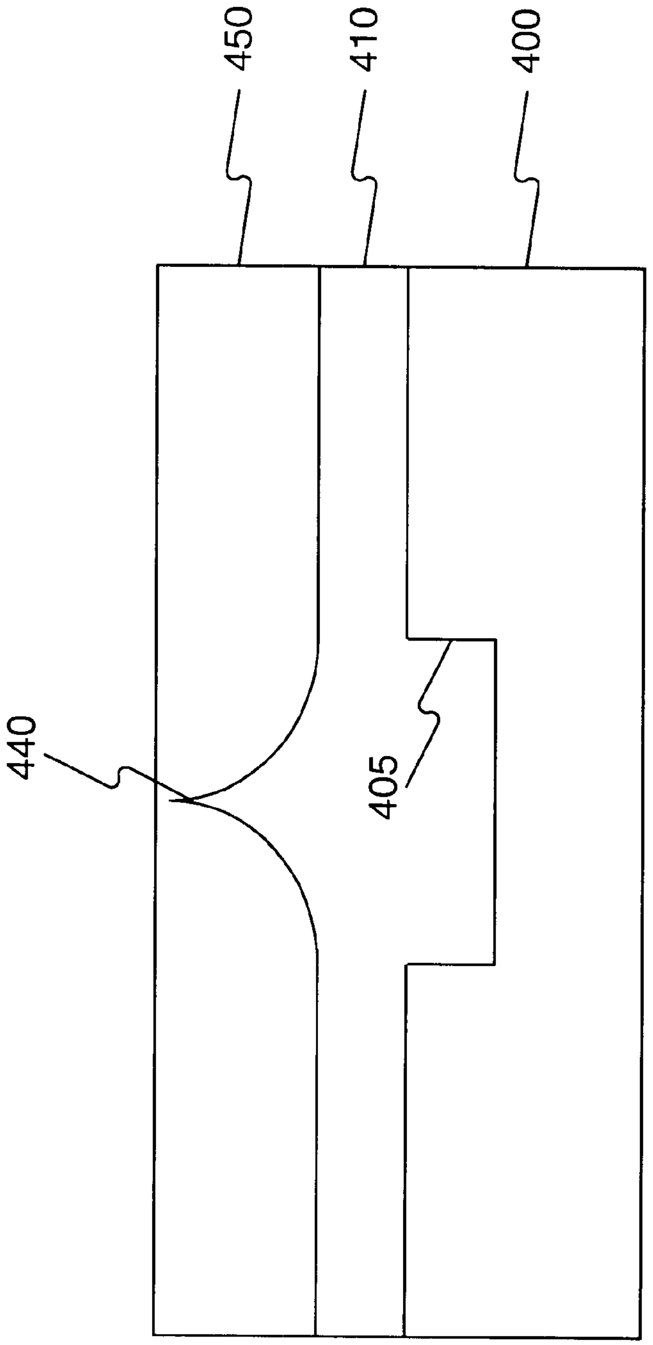
Figure 4E:
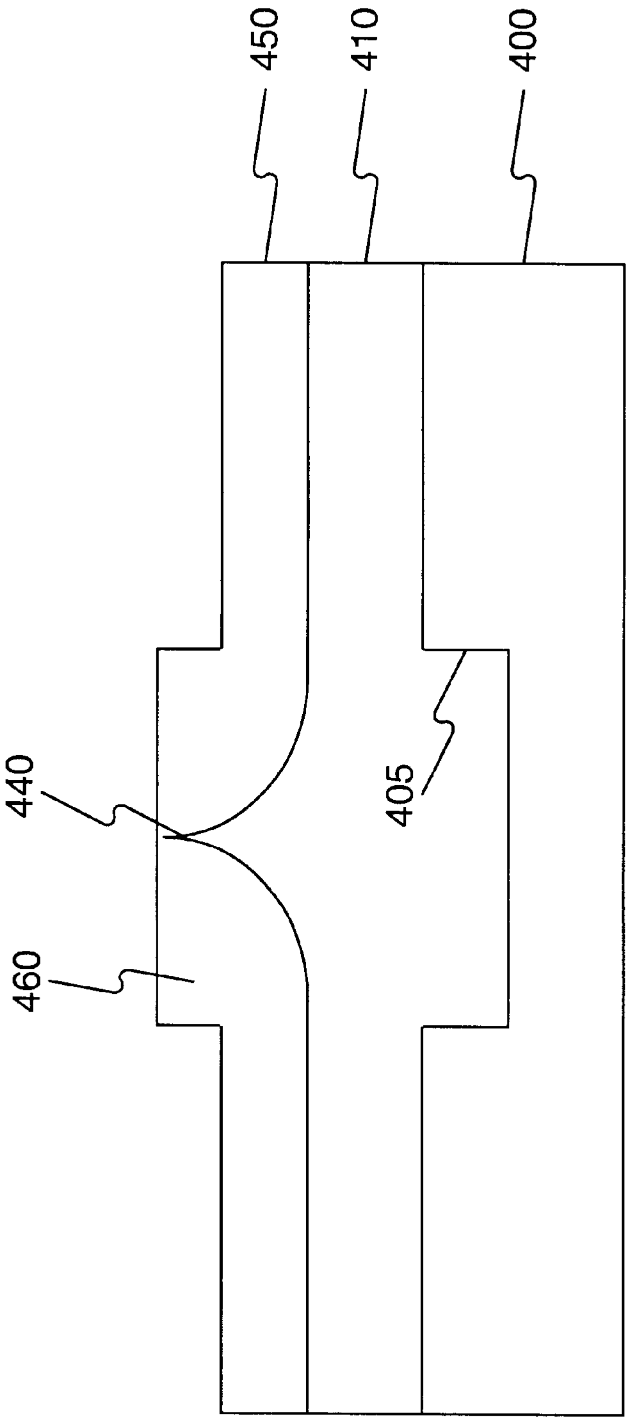
Figure 4F:
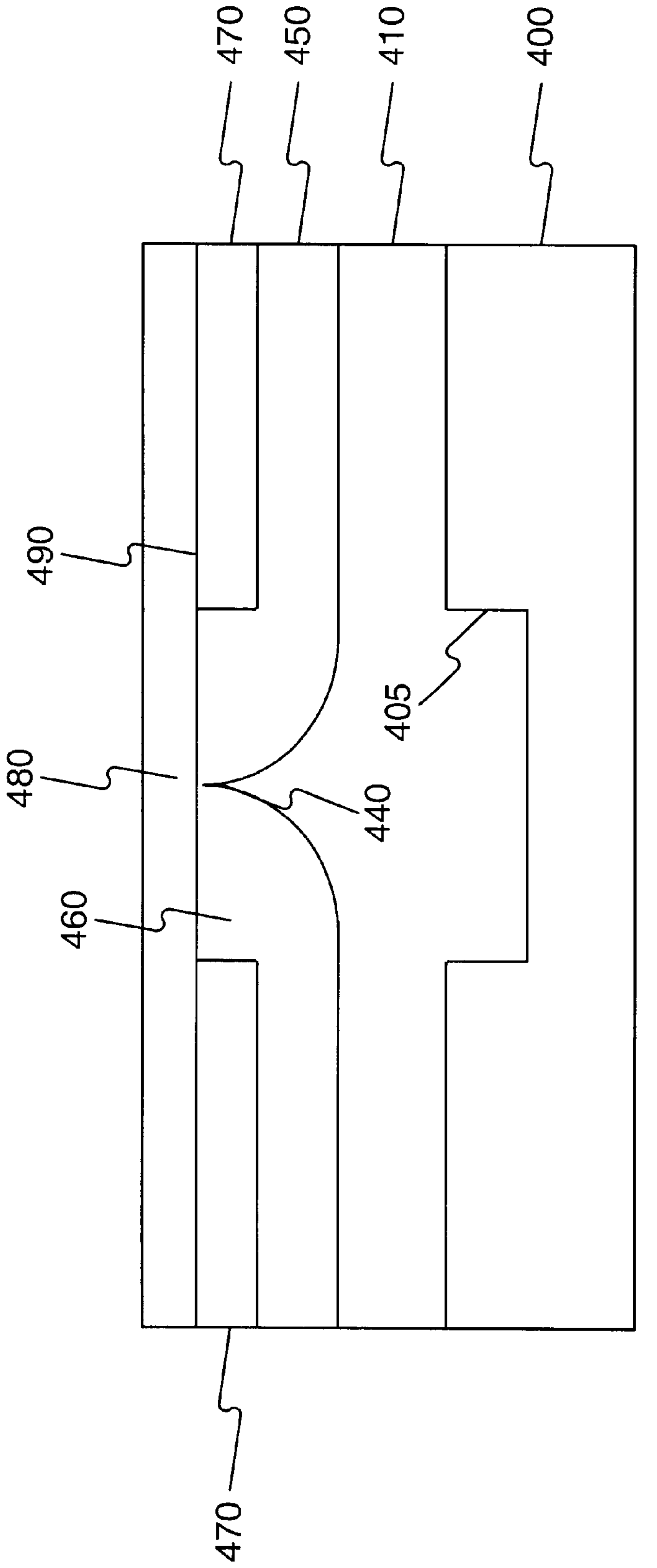
Figure 4G:
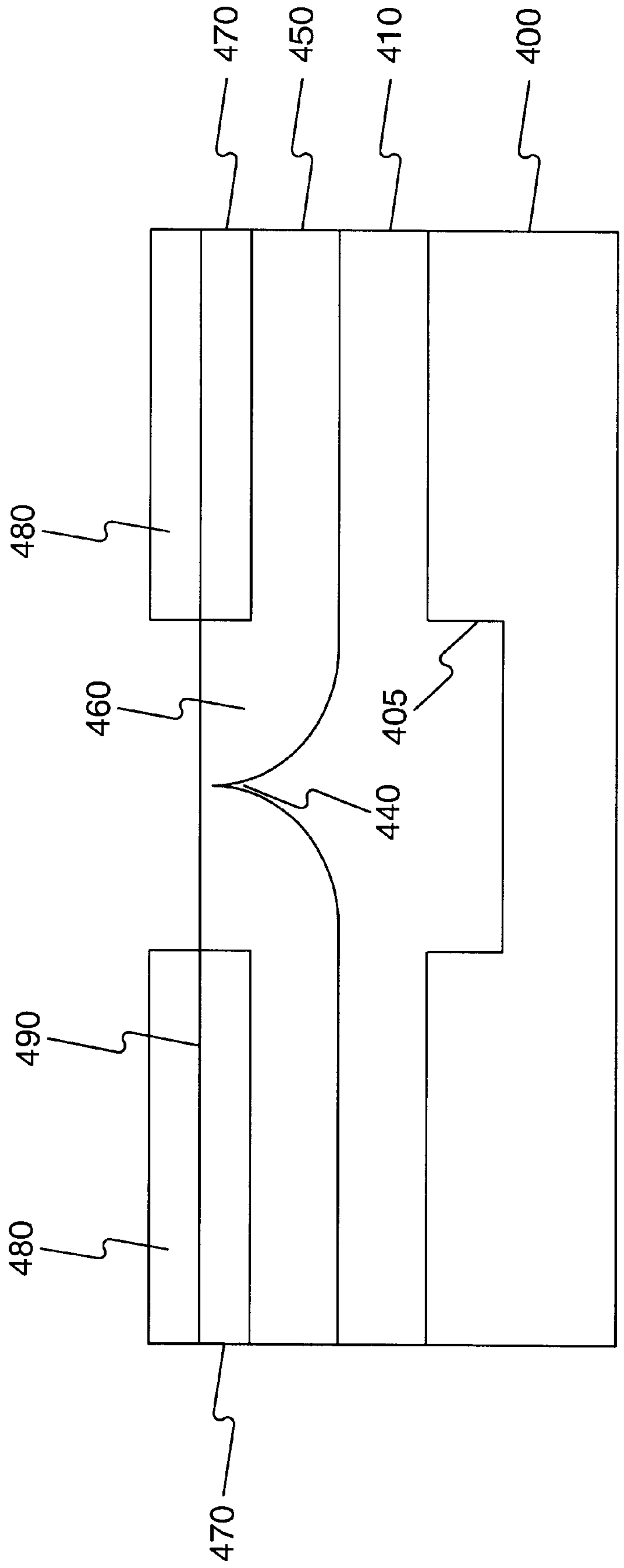
Figure 4H:
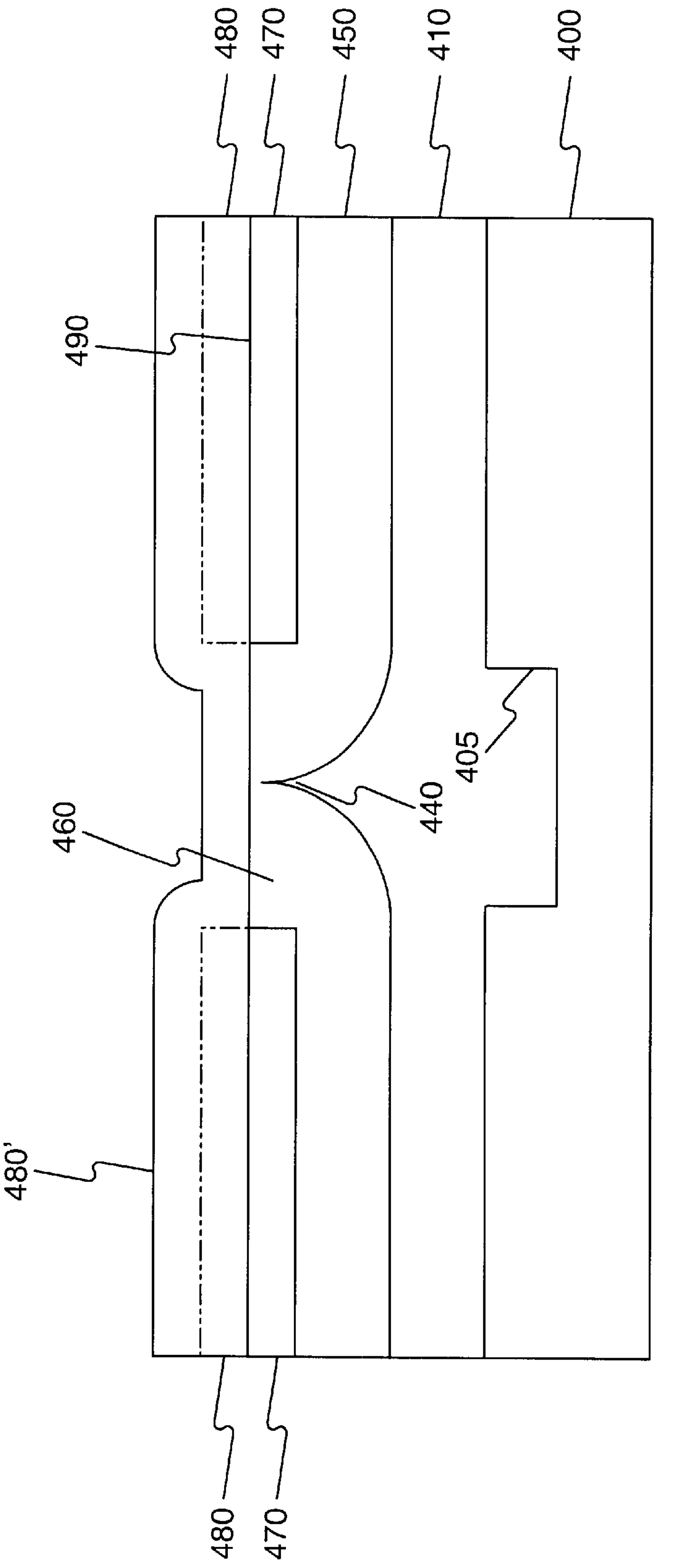
Figure 4I:
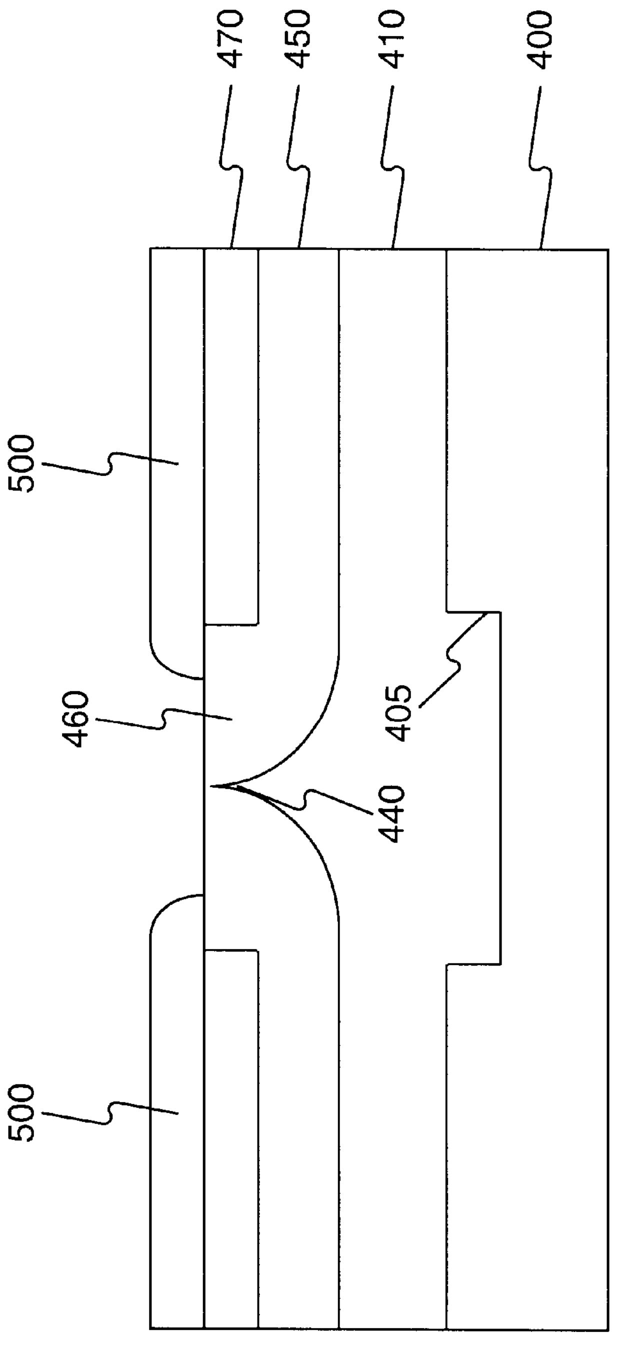
Figure 4J:
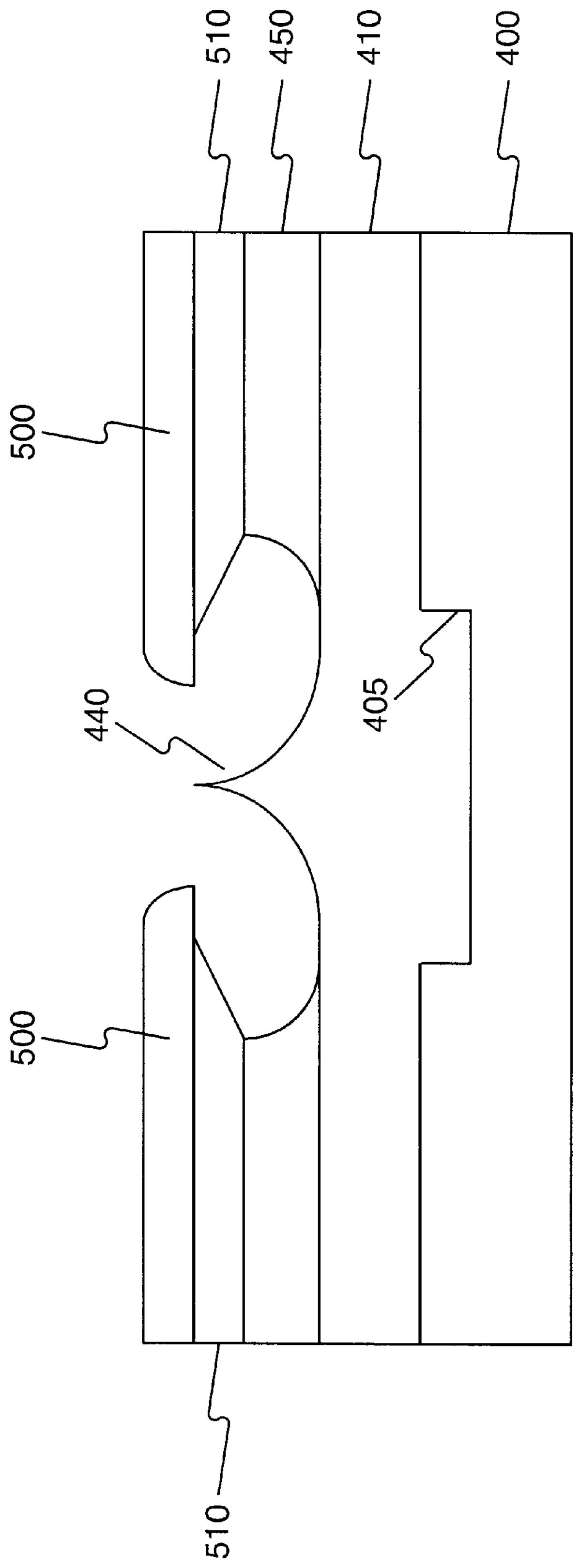
Figure 4K:
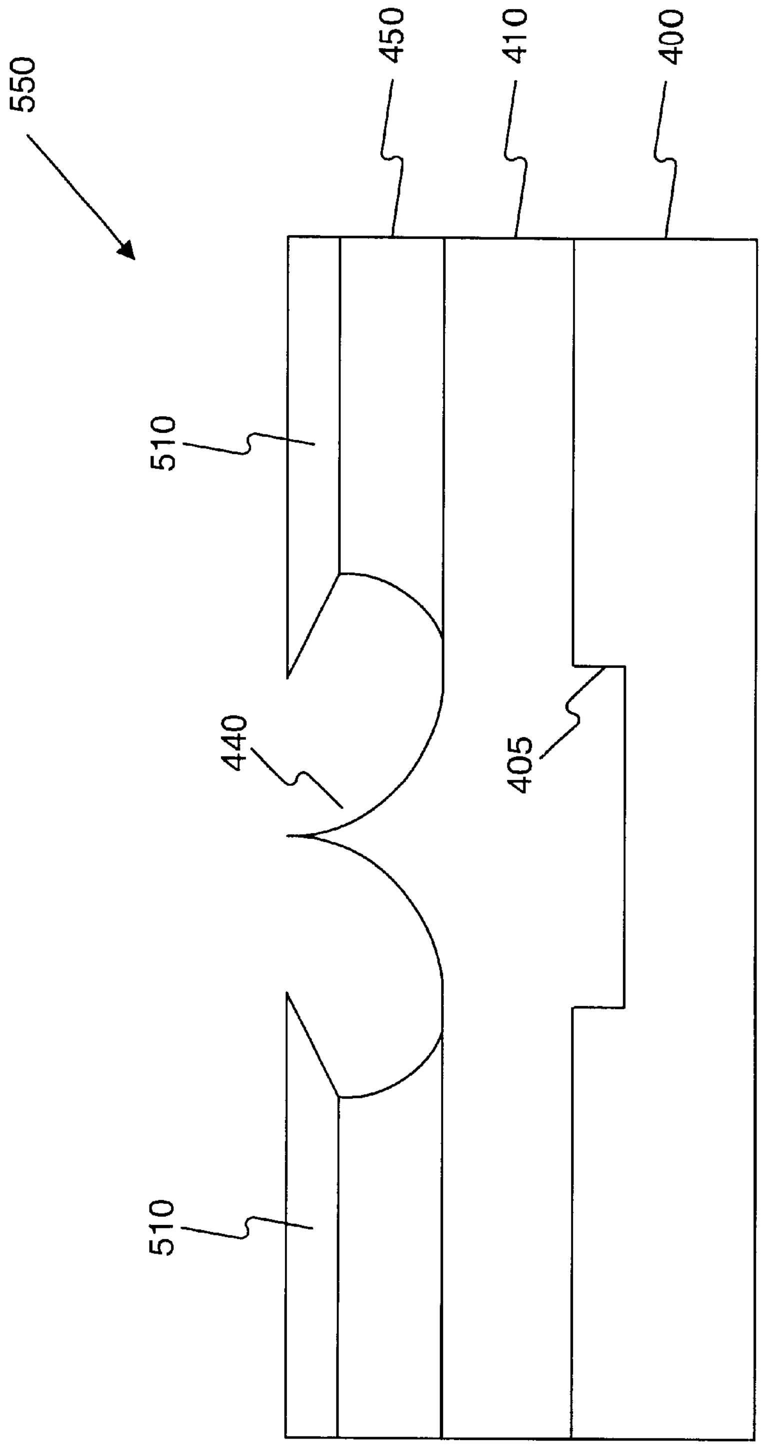
Figure 5:
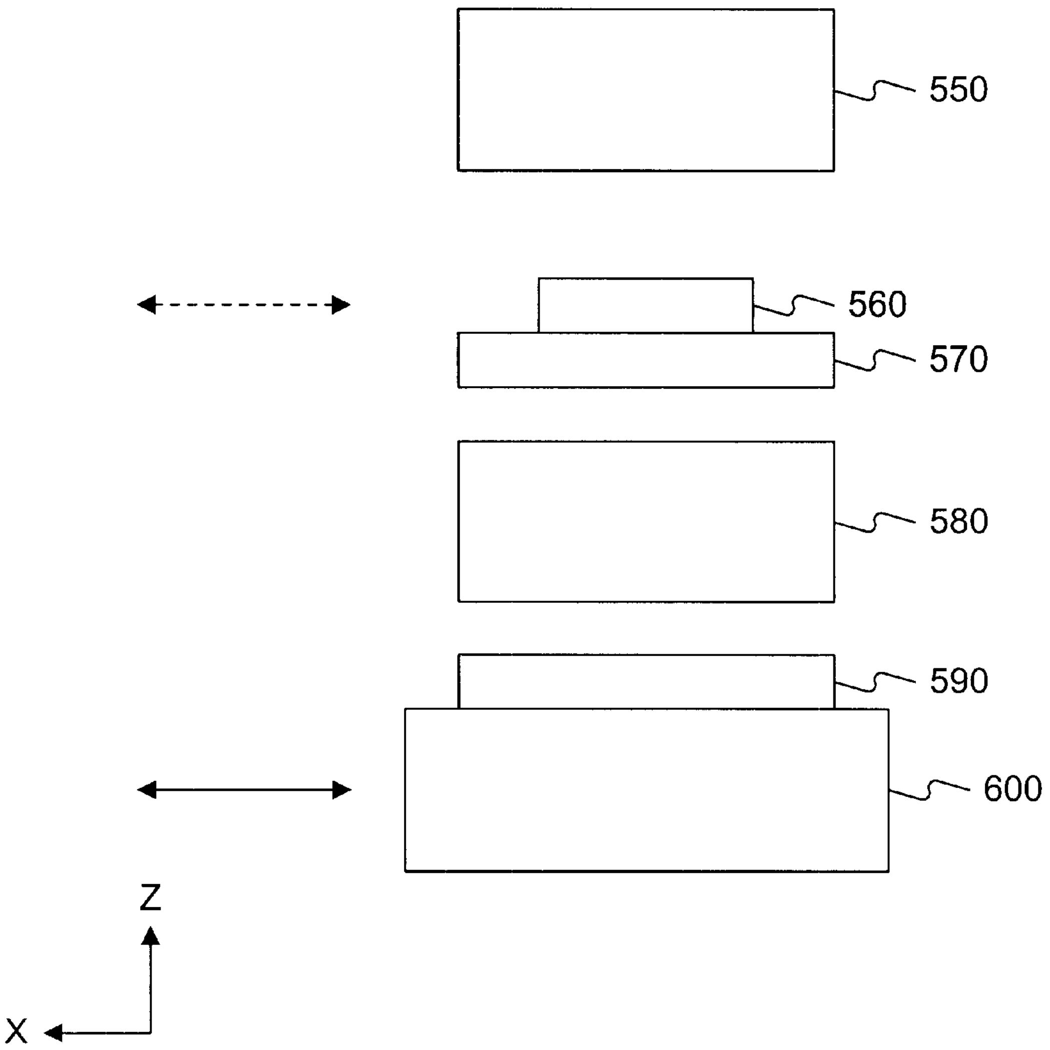
FIG. 5 is an schematic illustration of a projection exposure apparatus consistent with the present invention.

A projection exposure apparatus is then used to form shallow holes 405 on substrate 400. The projection exposure apparatus can be a scanning- or stepping-type projection exposure apparatus that employs any type of radiation. The process of forming holes 405 depends on the type of projection exposure apparatus used. For example, when a projection exposure apparatus employing irradiation based on a light beam is used, a photoresist, e.g., a positive photoresist, is applied to substrate 400. FIG. 5 schematically illustrates a projection exposure apparatus employing irradiation based on a light beam, which includes functions associated with conventional projection exposure apparatus.. The projection exposure apparatus has a light source 550, which illuminates a photomask 560 placed on reticle stage 570. Reticle stage 570 can move along the X-axis synchronously with stage 600 during exposure, if a scanning-type exposure is employed. Photomask 560, which has a patterned plate that selectively transmits light, is disposed on an object side of a projection optical lens system 580 of the projection exposure apparatus and a wafer 590, including substrate 400 having the photoresist thereon, is placed at the image side of projection optical lens system 580, on stage 600. Exposure is carried out to transfer the pattern of photomask 560 onto the photoresist.

After the pattern is formed, etching removes portions of the substrate based on the pattern of photomask 560. The pattern of photomask 560 and the etching process is configured based on the sharpness of the tips to be formed. For example, by varying the diameter and depth of the holes, tips with differing sharpness characteristics can be obtained. A silicon layer 410 of epitaxially-grown or deposited silicon (dependent on the structure of substrate 400) is then formed on substrate 400 to cover holes 405. Because silicon layer 410 is of a uniform thickness, a valley is formed in portions above the holes 405. Subsequently, silicon layer 410 is covered by an oxide masking layer 420, which can be composed of, for example, $SiO_2$.

As shown in FIG. 4(*b*), a planarizing process, such as chemical-mechanical polishing (CMP), is performed thereafter to remove oxide masking layer 420 except in the valley above hole 405. The remaining portion of masking layer 420 is a cap 430 having a downwardly extending tip.

As shown in FIG. 4(*c*), following the CMP process, a silicon tip 440 is formed as an upwardly extending peak.

Figure 6:
FIG. 6 is an SEM photograph of actual tips of FEDs formed by a process consistent with the present invention.

FIG. 6 shows an SEM photograph of actual tips formed by the process of the present invention. Notably, when silicon tip 440 is formed, cap 430 serving as an oxide hard mask is also consumed. Therefore, no extra step is required for removing a residual hard mask as in other conventional methods. Tip 440 is formed and cap 430 is consumed during a reactive ion etch (RIE).

The following is one example of an etching recipe that can produce a sharp silicon tip 440. Fluorocarbon is introduced into the chamber at a flow rate in the range of approximately 25 to 75 sccm and a temperature in the range of approximately 20 to 60° C. The etching proceeds for approximately fifty seconds. Because of the differing properties of silicon layer 410 and cap 430, the gas removes cap 430 and gives a controlled slope to silicon tip 440. Of course, other gases or mixtures of gases, for example including argon, and parameters are within the scope of the invention. Adjusting these variable parameters can help to achieve a desired sharpness of tip 440.

After tip 440 is formed, a thick oxide layer 450 of $SiO_2$ is deposited to cover tip 440.

As shown in FIG. 4(*d*), RIE is then used to planarize the oxide surface so that only a thin layer of oxide layer 450 with a thickness of approximately 100 Å remains above tip 440. Alternatively, CMP can be used to polish oxide layer 450 to leave a thickness of oxide layer 450 above tip 400 of approximately 100 Å. Thus, the CMP should stop when tip 440 is nearly exposed, i.e., such that the thin layer of oxide layer 450 remains above tip 440.

As shown in FIG. 4(*e*), planarized oxide layer 450 is partially etched to form a step 460 around tip 440. Preferably, this partial etch can use the same projection exposure apparatus and the same photomask that was used to form holes 405 in substrate 400. For example, for use with the projection exposure apparatus shown in FIG. 5, a photoresist having an opposite reaction to that of the photoresist used to form holes 405, e.g., a negative photoresist when a positive photoresist is used to form holes 405, is applied to planarized oxide layer 450. Photomask 560 is placed on the object side of projection optical lens system 580 of the projection exposure apparatus and substrate 400 including the structure having planarized oxide layer 450 with the negative photoresist is placed on the image side of projection optical lens system 580. Exposure is carried out to transfer the pattern of photomask 560 onto the photoresist. After the pattern is formed, etching removes portions of oxide layer 450 based on the pattern of photomask 560.

Then, as shown in FIG. 4(*f*), a metal 470 is formed on portions of the oxide layer 450 other than step 460. This metal can be deposited uniformly and then etched away, by, for example, CMP to remove the metal deposited on step 460. A silicon nitride layer 480 is then formed on step 460 and metal 470. Preferably, a thin oxide layer 490 is also formed between silicon nitride layer 480 and metal 470 to relieve stress between metal and silicon nitride.

RIE is then used to etch away the portion of silicon nitride layer 480 above step 460. As shown in FIG. 4(*g*), preferably, the RIE stops etching when it reaches step 460. Preferably, this partial etch can use the same projection exposure apparatus and the same photomask that was used to form holes 405 in substrate 400 and step 460 in oxide layer 450. For example, for use with the projection exposure apparatus in FIG. 5, a photoresist having the same reaction as that of the photoresist used to form holes 405, e.g., a positive photoresist when a positive photoresist is used to form holes 405, is applied to silicon nitride layer 480. The same photomask is placed on the object side of projection optical lens system 580 of the projection exposure apparatus and substrate 400 including the structure having nitride layer 480 with positive photoresist is placed on the image side of projection optical lens system 580. Exposure is carried out to transfer the pattern of photomask 560 onto the photoresist. After the pattern is formed, etching removes portions of silicon nitride layer 480 based on the pattern of photomask 560. While the same photomask is used repeatedly in three of the exposure operations of the present invention, any other combination of using the same photomask as in previous steps is also possible.

As shown in FIG. 4(*h*), an additional layer of silicon nitride 480' is then uniformly deposited on the device. As shown in FIG. 4(*i*), layer 480' is uniformly etched. The uniform etch will preferably, stop when it reaches step 460, thereby forming silicon nitride spacers 500 which overlap step 460.

As illustrated in FIG. 4(*j*), a wet etch using, for example, a buffered HF solution, removes step 460 and thereby exposes tip 440. This process can result in the removal of some of metal 470 to form a metal ring 510.

Finally, silicon nitride layer 500 is removed by, for example, a wet chemical etch as shown in FIG. 4(*k*). Hot, concentrated phosphoric acid can be used to perform this wet chemical etch. A FED 550 is the structure that results from the process.

Field emission devices manufactured in accordance with the present invention can be used during manufacturing and operating a flat panel display (FPD). A FPD having FEDs of the present invention can provide a sharper picture, consume less power, and occupy less space, especially when compared to a cathode ray tube display.

It will be apparent to those skilled in the art that various modifications and variations can be made in the context of the present invention and in its practice without departing from the scope or spirit of the invention.

As an example, the processes involved in this invention can also be applied to manufacturing of other types of semiconductor devices. Depending on process requirements, combinations of several of the steps can be used to achieve formation of special structures in other devices.

Also, those skilled in the art will recognize that the level of conductivity of the materials used in the process can be varied, as demanded by the final product sought to be produced. Further, the invention is not limited to silicon-based embodiments, and other suitable materials may be used.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of operating a projection exposure apparatus, comprising:

placing a first layer of exposure sensitive material on a first layer of material of a device;

exposing the first layer of exposure sensitive material using a mask;

removing portions of the first layer of material in accordance with the exposure of the first layer of exposure sensitive material;

placing a second layer of exposure sensitive material on a second layer of material of the device;

exposing the second layer of exposure sensitive material using the mask;

removing portions of the second layer of material in accordance with the exposure of the second layer of exposure sensitive material;

placing a third layer of exposure sensitive material on a third layer of material of the device; and exposing the third layer of exposure sensitive material using the mask, including forming a field emission device or plurality of field emission devices after exposing the third layer of exposure sensitive material, wherein a tip on the field emission device or plurality of tips on the field emission devices can be obtained with differing sharpness characteristics by varying the depth and diameter of holes in the mask.

2. A method according to claim 1, further comprising:

providing the first and third layers of exposure sensitive materials that are of the same exposure type and providing the second layer of exposure sensitive material that is of an opposite exposure type.

3. A method according to claim 2, wherein the providing of the first and third layers of exposure sensitive materials includes providing a positive photoresist and providing the second layer of exposure sensitive material includes providing a negative photoresist.

4. A method according to claim 1, further comprising:

removing portions of the third layer of exposure sensitive material in accordance with the exposure of the third layer of exposure sensitive material.

* * * * *